(12) United States Patent
Lee

(10) Patent No.: US 11,728,319 B2
(45) Date of Patent: Aug. 15, 2023

(54) SEMICONDUCTOR PACKAGE INCLUDING A SUBSTRATE, A SEMICONDUCTOR DEVICE, AND A MOLD

(71) Applicant: SAMSUNG ELECTRONICS CO., LTD., Suwon-si (KR)

(72) Inventor: Sang-Won Lee, Seoul (KR)

(73) Assignee: SAMSUNG ELECTRONICS CO., LTD, Suwon-si (KR)

(*) Notice: Subject to any disclaimer, the term of this patent is extended or adjusted under 35 U.S.C. 154(b) by 220 days.

(21) Appl. No.: 17/198,763

(22) Filed: Mar. 11, 2021

(65) Prior Publication Data

US 2022/0059514 A1 Feb. 24, 2022

(30) Foreign Application Priority Data

Aug. 24, 2020 (KR) .................. 10-2020-0106442

(51) Int. Cl.
*H01L 23/48* (2006.01)
*H01L 23/52* (2006.01)
(Continued)

(52) U.S. Cl.
CPC .......... *H01L 25/105* (2013.01); *H01L 21/561* (2013.01); *H01L 23/3128* (2013.01); *H01L 25/18* (2013.01); *H01L 23/295* (2013.01); *H01L 24/16* (2013.01); *H01L 24/48* (2013.01); *H01L 24/73* (2013.01); *H01L 2224/16227* (2013.01); *H01L 2224/48227* (2013.01); *H01L 2224/73204* (2013.01); *H01L 2225/1023* (2013.01); *H01L 2225/1041* (2013.01); *H01L 2225/1058* (2013.01); *H01L 2924/19041* (2013.01); *H01L 2924/19106* (2013.01)

(58) Field of Classification Search
CPC ... H01L 25/105; H01L 23/3128; H01L 25/18; H01L 2225/1023; H01L 2225/1041; H01L 2225/1058; H01L 2924/19041; H01L 2924/19106
USPC ........................................................ 257/774
See application file for complete search history.

(56) References Cited

U.S. PATENT DOCUMENTS 9,583,430 B2    2/2017  Park et al.
10,607,971 B2   3/2020  Im et al.
(Continued)

FOREIGN PATENT DOCUMENTS

KR  10-2019-0133907 A   12/2019

*Primary Examiner* — Caleb E Henry
*Assistant Examiner* — Dilinh P Nguyen
(74) *Attorney, Agent, or Firm* — Sughrue Mion, PLLC

(57) ABSTRACT

A semiconductor package includes a first sub-semiconductor package, an interposer substrate, and a second sub-semiconductor package that are sequentially stacked. The first sub-semiconductor package includes a first package substrate, a first semiconductor device, and a first mold member that are sequentially stacked, and the interposer substrate includes at least one hole. The first mold member includes: a mold main portion which covers the first semiconductor device; a mold connecting portion extended from the mold main portion and inserted into the at least one hole; and a mold protruding portion extended from the mold connecting portion to cover a top surface of the interposer substrate outside the at least one hole. The mold main portion, the mold connecting portion, and the mold protruding portion constitute a single object.

20 Claims, 15 Drawing Sheets

(51) Int. Cl.
*H01L 25/10* (2006.01)
*H01L 23/31* (2006.01)
*H01L 21/56* (2006.01)
*H01L 25/18* (2023.01)
*H01L 23/00* (2006.01)
*H01L 23/29* (2006.01)

(56) References Cited

U.S. PATENT DOCUMENTS

| | | |
|---|---|---|
| 10,756,075 B2 * | 8/2020 | Hong ................. H01L 25/50 |
| 2013/0147026 A1 | 6/2013 | Topacio et al. |
| 2018/0315740 A1 | 11/2018 | Im et al. |
| 2019/0363073 A1 | 11/2019 | Hong et al. |
| 2020/0020613 A1 | 1/2020 | Kim |
| 2020/0118992 A1 * | 4/2020 | Yoo .................... H01L 25/18 |

\* cited by examiner

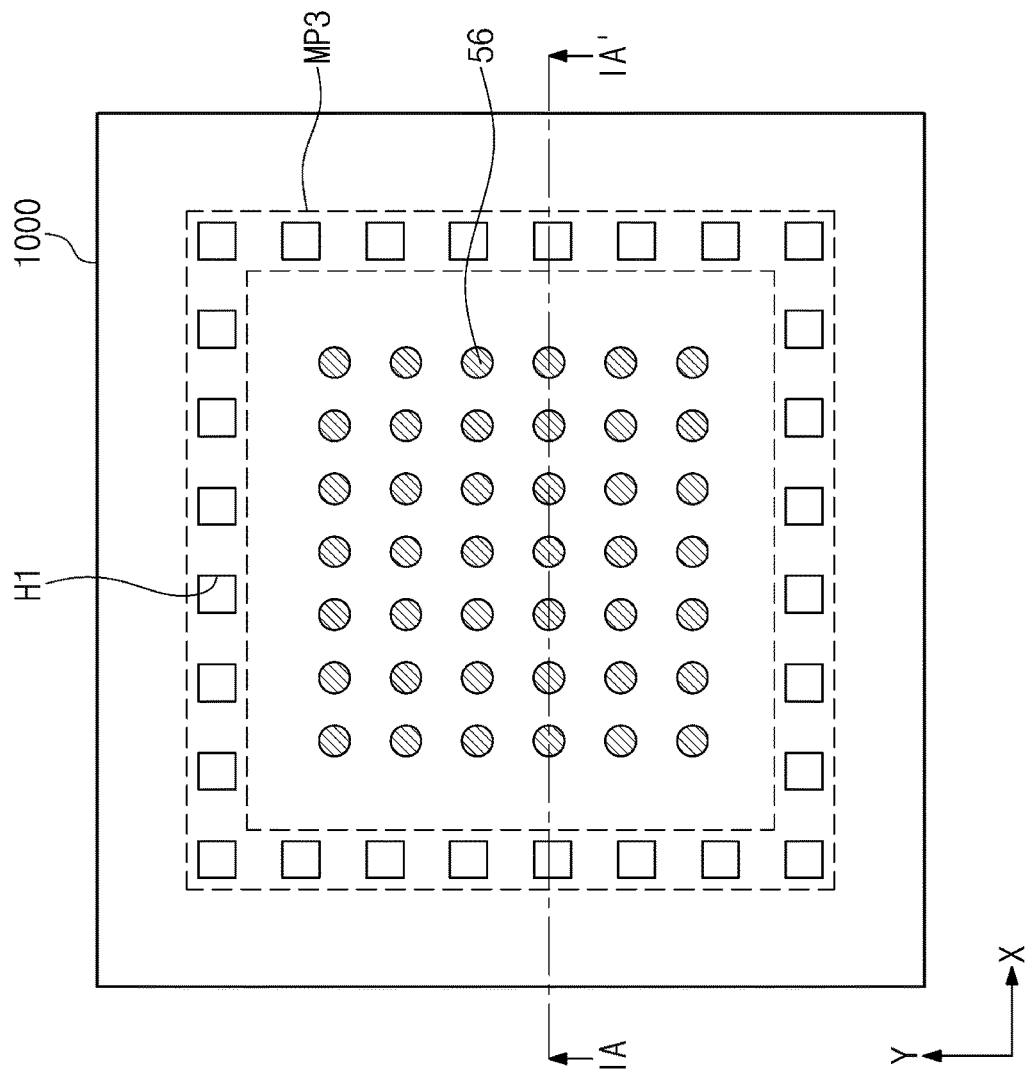

SEMICONDUCTOR PACKAGE INCLUDING A SUBSTRATE, A SEMICONDUCTOR DEVICE, AND A MOLD

CROSS-REFERENCE TO RELATED APPLICATION

This application claims priority from Korean Patent Application No. 10-2020-0106442, filed on Aug. 24, 2020, in the Korean Intellectual Property Office, the disclosure of which is incorporated by reference herein in its entirety.

BACKGROUND

1. Field

Devices, methods and systems consistent with example embodiments relate to a semiconductor package.

2. Description of Related Art

A semiconductor package is configured to easily use a semiconductor chip as a part of an electronic product. The semiconductor package includes a printed circuit board (PCB) and a semiconductor chip, which is mounted on the PCB and is electrically connected to the PCB using bonding wires or bumps. With development of the electronics industry, many studies are being conducted to improve reliability of the semiconductor package and to reduce a size of the semiconductor package.

SUMMARY

Example embodiments provide a semiconductor package with improved reliability.

According to an example embodiment, a semiconductor package may include a first sub-semiconductor package, an interposer substrate, and a second sub-semiconductor package, which are sequentially stacked. The first sub-semiconductor package may include a first package substrate, a first semiconductor device, and a first mold member, which are sequentially stacked. The interposer substrate may include at least one first hole, and the first mold member may include a mold main portion covering the first semiconductor device, a mold connecting portion extended from the mold main portion and inserted into the first hole, and a mold protruding portion extended from the mold connecting portion to cover a top surface of the interposer substrate outside the first hole. The mold main portion, the mold connecting portion, and the mold protruding portion may constitute a single object.

According to an example embodiment, a semiconductor package may include a first sub-semiconductor package, an interposer substrate, and a second sub-semiconductor package, which are sequentially stacked. The first sub-semiconductor package may include a first package substrate, a first semiconductor device, and a first mold member, which are sequentially stacked. The interposer substrate may include at least one first hole, and the first mold member may include a mold main portion covering the first semiconductor device, a mold connecting portion extended from the mold main portion and inserted into the first hole, and a mold protruding portion extended from the mold connecting portion to cover a top surface of the interposer substrate outside the first hole. The interposer substrate may include an upper conductive pad and a lower conductive pad, which are respectively disposed on top and bottom surfaces of the interposer, and a conductive via, which connects the upper conductive pad to the lower conductive pad. The conductive via may have a first width, the mold connecting portion may have a second width, and the second width may be larger than the first width.

According to an example embodiment, a semiconductor package may include a first package substrate, a first semiconductor device mounted on the first package substrate, a first mold member covering the first semiconductor device, an interposer substrate on the first mold member, a second package substrate on the interposer substrate, a second semiconductor device mounted on the second package substrate, first inner connection members penetrating the first mold member and connecting the first package substrate to the interposer substrate, and second inner connection members connecting the interposer substrate to the second package substrate. The interposer substrate may include at least one first hole, and the first mold member may be extended onto a top surface of the interposer substrate through the first hole. The number of the second inner connection members may be greater than the number of the first inner connection members.

BRIEF DESCRIPTION OF THE DRAWINGS

The above and other aspects, features and advantages will be more clearly understood from the following detailed description of example embodiments, taken in conjunction with the accompanying drawings, in which:

FIG. 8A is a plan view illustrating a semiconductor package according to an example embodiment.

DETAILED DESCRIPTION

Example embodiments will now be described with reference to the accompanying drawings.

Figure 1:
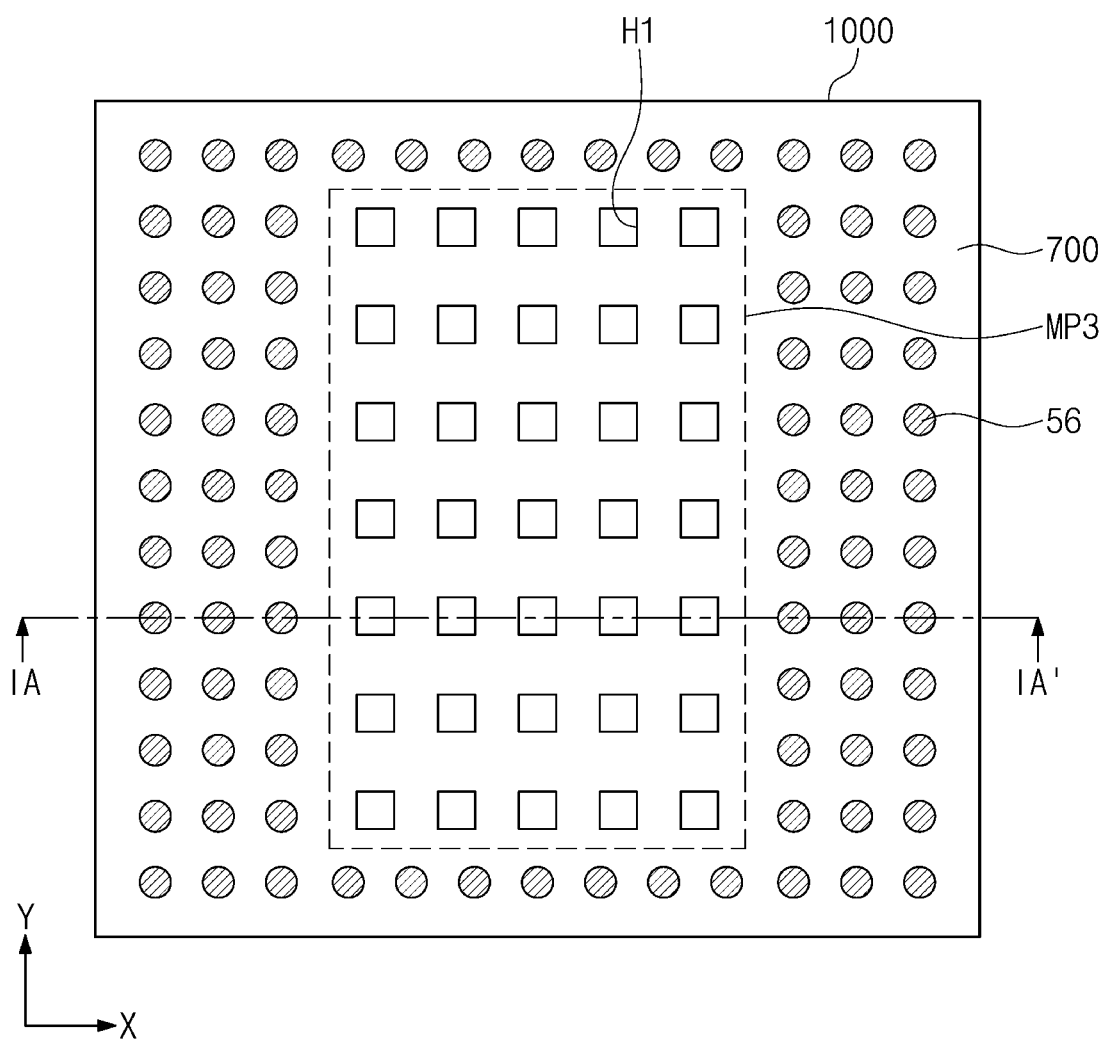
FIG. 1 is a schematic plan view illustrating a semiconductor package according to an example embodiment.
Figure 2:
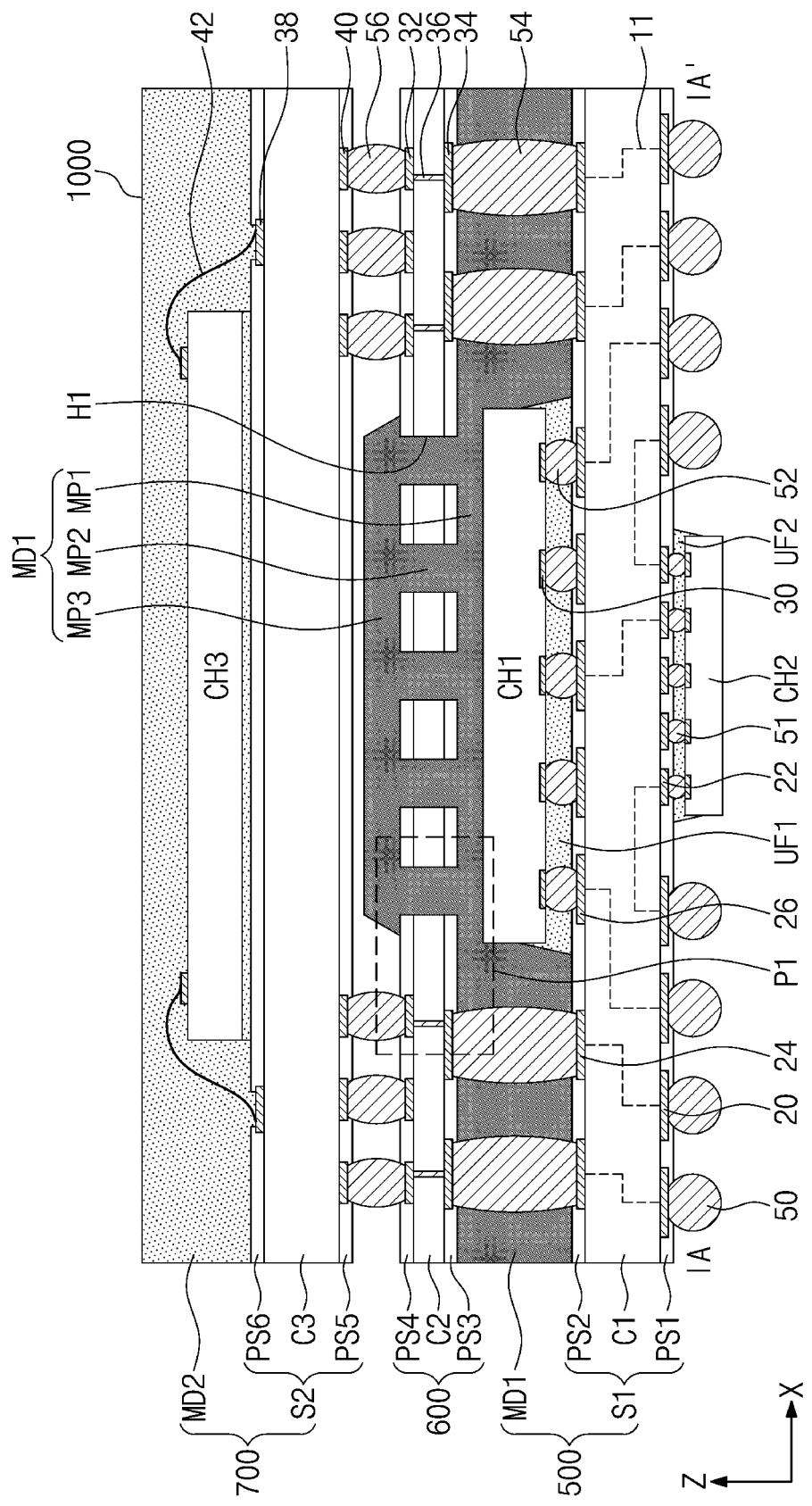
FIG. 2 is a sectional view taken along a line IA-IA' of FIG. 1.

FIG. 1 is a schematic plan view illustrating a semiconductor package according to an example embodiment. FIG. 2 is a sectional view taken along a line IA-IA' of FIG. 1.

Referring to FIGS. 1 and 2, a semiconductor package 1000 according to the example embodiments may include a first sub-semiconductor package 500, an interposer substrate 600, and a second sub-semiconductor package 700, which are sequentially stacked.

The first sub-semiconductor package 500 may include a first package substrate S1, a first semiconductor device CH1 mounted on the first package substrate S1, and a first mold member MD1 covering side surfaces of the first semiconductor device CH1. The first package substrate S1 may be a double-sided or multi-layered printed circuit board. The first package substrate S1 may include a first body layer C1, a first upper protection layer PS2, and a first lower protection layer PS1. The first upper protection layer PS2 and the first lower protection layer PS1 may cover top and bottom surfaces, respectively, of the first body layer C1. The first body layer C1 may include a single insulating layer or a plurality of insulating layers. The first body layer C1 may be formed of or include at least one of thermosetting resins (e.g., epoxy resin), thermoplastic resins (e.g., polyimide), composite materials (e.g., prepreg or fire resist-4 (FR4)), in which a reinforcement element (e.g., glass fiber and/or inorganic filler) is pre-impregnated with a thermoplastic or thermosetting resin matrix, or photo-curable resins, but the inventive concept is not limited thereto. The first upper protection layer PS2 and the first lower protection layer PS1 may be photosensitive solder resist (PSR) layers.

First and second upper conductive pads 24 and 26 may be disposed on the first body layer C1, and first and second lower conductive pads 20 and 22 may be disposed on a bottom surface of the first body layer C1. Inner lines 11, which are used to connect the first and second upper conductive pads 24 and 26 to the first and second lower conductive pads 20 and 22, may be disposed in the first body layer C1. The first upper protection layer PS2 may be provided to expose the first and second upper conductive pads 24 and 26. The first lower protection layer PS1 may be provided to expose the first and second lower conductive pads 20 and 22.

The first semiconductor device CH1 may be mounted on the first package substrate S1 in a flip-chip bonding manner. The first semiconductor device CH1 may be a single semiconductor die or chip or may be a semiconductor package including a plurality of semiconductor dies of the same kind or different kinds. The first semiconductor device CH1 may be one of image sensor chips (e.g., a CMOS imaging sensor (CIS)), memory device chips (e.g., FLASH memory chips, dynamic random access memory (DRAM) chips, static RAM (SRAM) chips, electrically erasable programmable read-only memory (EEPROM) chips, phase-change RAM (PRAM) chips, magnetoresistive RAM (MRAM) chips, resistive RAM (ReRAM) chips, high bandwidth memory (HBM) chips, hybrid memory cubic (HMC) chips), microelectromechanical system (MEMS) chips, or application-specific integrated circuit (ASIC) semiconductor chips. The first semiconductor device CH1 may include a chip pad 30.

First inner connection members 52 may connect the first semiconductor device CH1 electrically to the first package substrate S1. The first inner connection members 52 may connect the chip pad 30 to the second upper conductive pad 26. The first inner connection members 52 may include at least one of a solder ball, a conductive bump, or a conductive pillar. A first under-fill layer UF1 may be interposed between the first semiconductor device CH1 and the first package substrate S1. The first under-fill layer UF1 may include a thermosetting resin or a photo-curable resin. In addition, the first under-fill layer UF1 may further include an organic filler or an inorganic filler.

The interposer substrate 600 may be a double-sided or multi-layered printed circuit board. The interposer substrate 600 may include a second body layer C2, a second upper protection layer PS4, and a second lower protection layer PS3. The second upper protection layer PS4 and the second lower protection layer PS3 may cover top and bottom surfaces, respectively of the second body layer C2. The second body layer C2 may include a single insulating layer or a plurality of insulating layers. The second body layer C2 may be formed of or include the same or similar material as the first body layer C1. Third upper conductive pads 32 may be disposed on a top surface of the second body layer C2. Third lower conductive pads 34 may be disposed on a bottom surface of the second body layer C2. Conductive vias 36 may be disposed in the second body layer C2 to electrically connect the third lower conductive pads 34 to the third upper conductive pads 32.

Figure 5A:
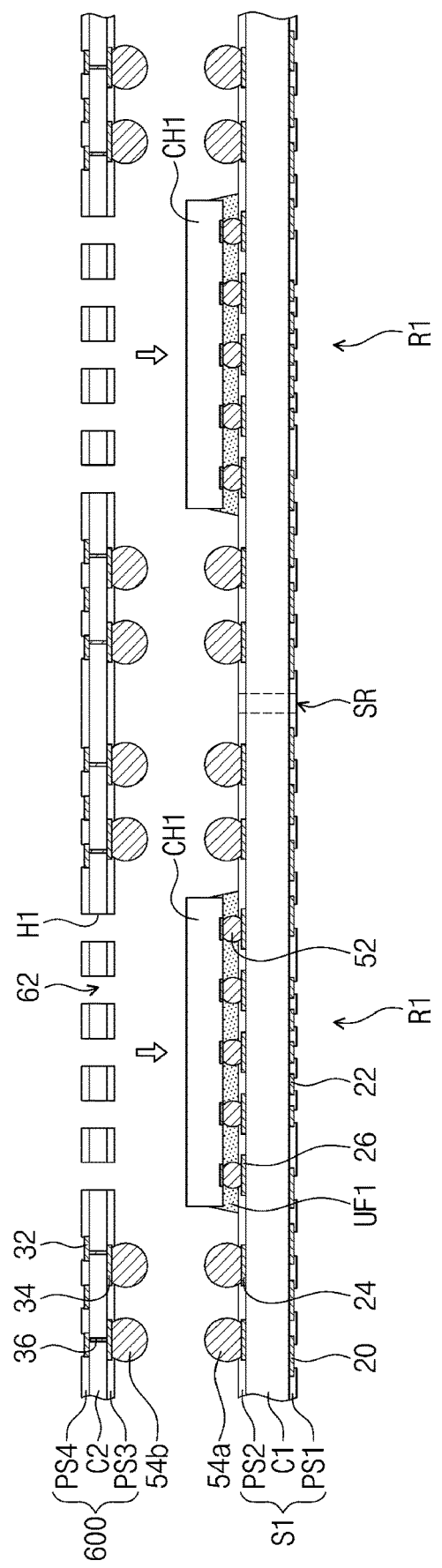
FIGS. 5A, 5B, 5C, 5D, and 5E are sectional views illustrating a process of fabricating the semiconductor package according to an example embodiment.
Figure 5B:
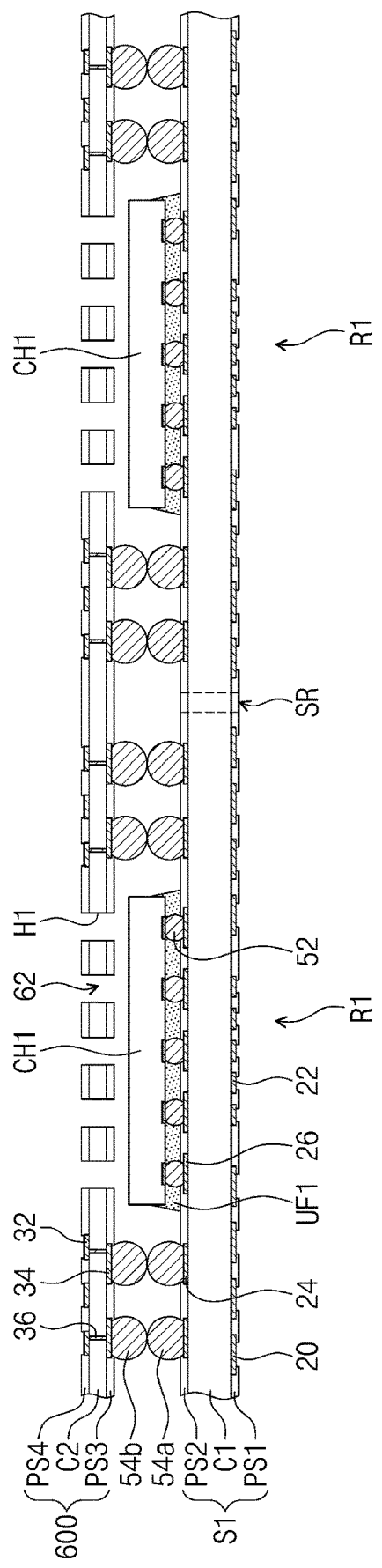

The interposer substrate 600 may include one or more first holes or first openings 62 (see also FIGS. 5A and 5B). The first holes 62 are spaced apart from each other. The first holes 62 may be disposed in a center region of the interposer substrate 600. The first holes 62 may be spaced apart from the third upper conductive pads 32, the third lower conductive pads 34, and the conductive vias 36. Side surfaces H1 of the second upper protection layer PS4, the second body layer C2, and the second lower protection layer PS3 may be exposed by the first hole 62.

Figure 3A:
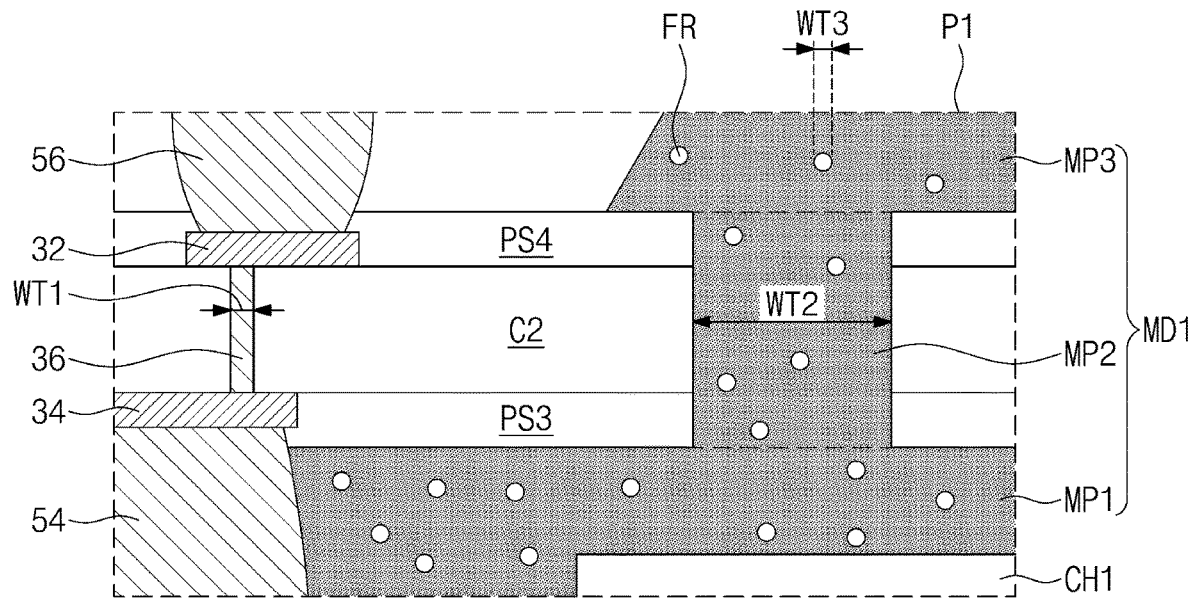
FIGS. 3A and 3B are enlarged sectional views illustrating a portion 'P1' of FIG. 2.
Figure 3B:
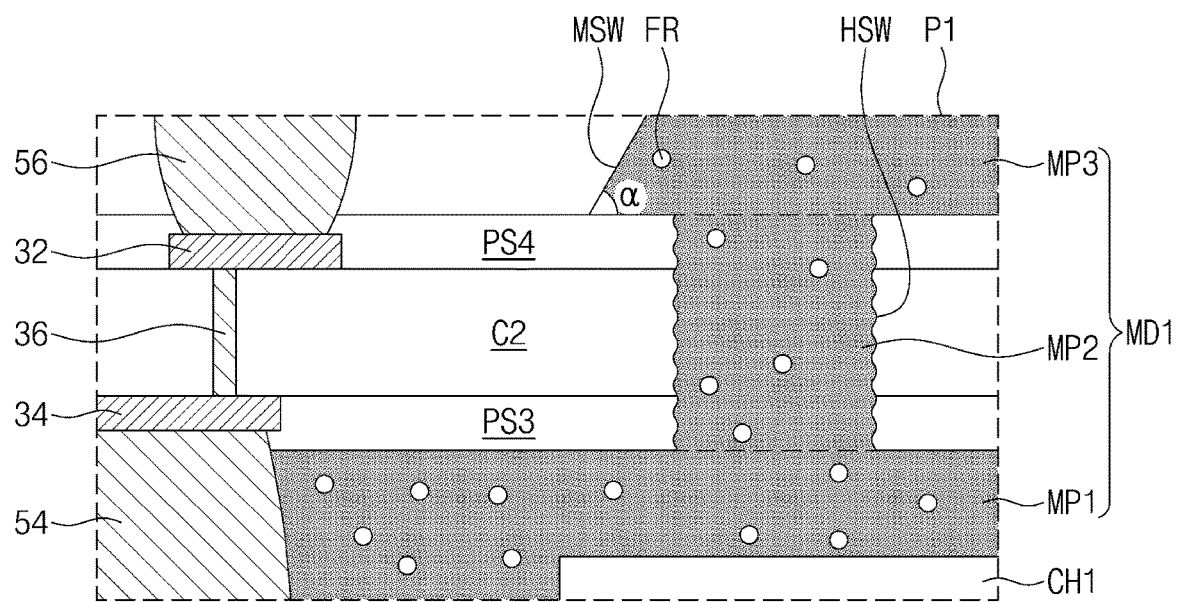

FIGS. 3A and 3B are enlarged sectional views illustrating a portion 'P1' of FIG. 2.

Referring to FIGS. 1, 2, and 3A, the first mold member MD1 may include a mold main portion MP1 covering the first semiconductor device CH1 and the first package substrate S1, a mold extended portion MP2 extended from the mold main portion MP1 into the first hole 62, and a mold protruding portion MP3 extended from the mold extended portion MP2 to protrude above a top surface of the interposer substrate 600. The mold main portion MP1, the mold extended portion MP2, and the mold protruding portion MP3 may be provided to constitute a single object or to have no interface therebetween. The mold protruding portion MP3 may cover 50% to 80% of an area of the top surface of the interposer substrate 600. The mold protruding portion MP3 may be in contact with an inner side surfaces surrounding the first hole 62 (i.e., side surfaces H1 of the second upper protection layer PS4, the second body layer C2, and the second lower protection layer PS3).

Referring to FIG. 3A, the conductive via 36 may have a first width WT1. The mold extended portion MP2 may have a second width WT2. The second width WT2 of the mold extended portion MP2 may correspond to an inner diameter of the first hole 62. The first mold member MD1 may be formed of or include an insulating resin (e.g., epoxy molding compound (EMC)). The first mold member MD1 may further include filler particles FR. The filler particles FR may be formed of or include an insulating material (e.g., silica). The filler particles FR may be dispersed in the insulating resin. Each of the filler particles FR may have a third width WT3 or a third diameter. The second width WT2 may be larger than the first width WT1. The second width WT2 may be larger than the third width WT3. In an example embodiment, the first width WT1 may be in a range of 10 μm to 70 μm, and the second width WT2 may be in a range of 500 μm to 1000 μm. The third width WT3 may be in a range of 1 μm to 50 μm.

Referring to FIG. 3B, a side surface MSW of the mold protruding portion MP3 may be inclined toward the mold extended portion MP2 at an acute angle α to a top surface of the second upper protection layer PS4. Alternatively, the side surface MSW of the mold protruding portion MP3 may be perpendicular to the top surface of the second upper protection layer PS4. A side surface HSW of the mold extended portion MP2 may be rougher than the side surface MSW of the mold protruding portion MP3. In other words, a surface roughness of the side surface HSW of the mold extended portion MP2 may be greater than a surface roughness of the side surface MSW of the mold protruding portion MP3.

Referring back to FIG. 2, outer connection terminals 50 may be bonded to the first lower conductive pads 20. A second semiconductor device CH2 may be bonded to the second lower conductive pads 22 by second inner connection members 51. The second semiconductor device CH2 may be a semiconductor chip or a capacitor device. A second under-fill layer UF2 may be interposed between the first package substrate S1 and the second semiconductor device CH2.

A third inner connection member 54 may be provided to penetrate the first mold member MD1 and to electrically connect the first package substrate S1 to the interposer substrate 600. The third inner connection member 54 may be in contact with the first upper conductive pad 24 and the third lower conductive pad 34.

The second sub-semiconductor package 700 may include a second package substrate S2, a third semiconductor device CH3 stacked on the second package substrate S2, and a second mold member MD2 covering the third semiconductor device CH3. The mold protruding portion MP3 may be spaced apart from the second package substrate S2. The second package substrate S2 may be a double-sided or multi-layered printed circuit board. The second package substrate S2 may include a third body layer C3, a third upper protection layer PS6, a third lower protection layer PS5, and fourth upper conductive pads 38 and fourth lower conductive pads 40, which are respectively disposed on top and bottom surfaces of the third body layer C3. The third semiconductor device CH3 may be connected to the fourth upper conductive pads 38 by a wire 42. Fourth inner connection members 56 may connect the interposer substrate 600 electrically to the second package substrate S2. The fourth inner connection members 56 may be in contact with the third upper conductive pad 32 and the fourth lower conductive pad 40. Each of the first to fourth inner connection members 52, 51, 54, and 56 may be a solder ball, a conductive bump, or a conductive pillar.

In the present example embodiment, the number of the third inner connection members 54 may be different from the number of the fourth inner connection members 56. For example, the number of the fourth inner connection members 56 may be greater than the number of the third inner connection members 54. Alternatively, the number of the third upper conductive pads 32 may be greater than the number of the third lower conductive pads 34. Due to the interposer substrate 600, it may be possible to increase a degree of freedom in constructing an interconnection structure of the semiconductor package 1000.

In the semiconductor package 1000 according to an example embodiment, the interposer substrate 600 may include at least one first hole 62, and thus, it may be possible to reduce a thermal or physical stress and to suppress or reduce a warpage in the semiconductor package 1000. In addition, the mold protruding portion MP3 may be used to support the second sub-semiconductor package 700 and to prevent the second sub-semiconductor package 700 from being excessively bent or drooping. Thus, the reliability of the semiconductor package 1000 may be improved.

Figure 4:
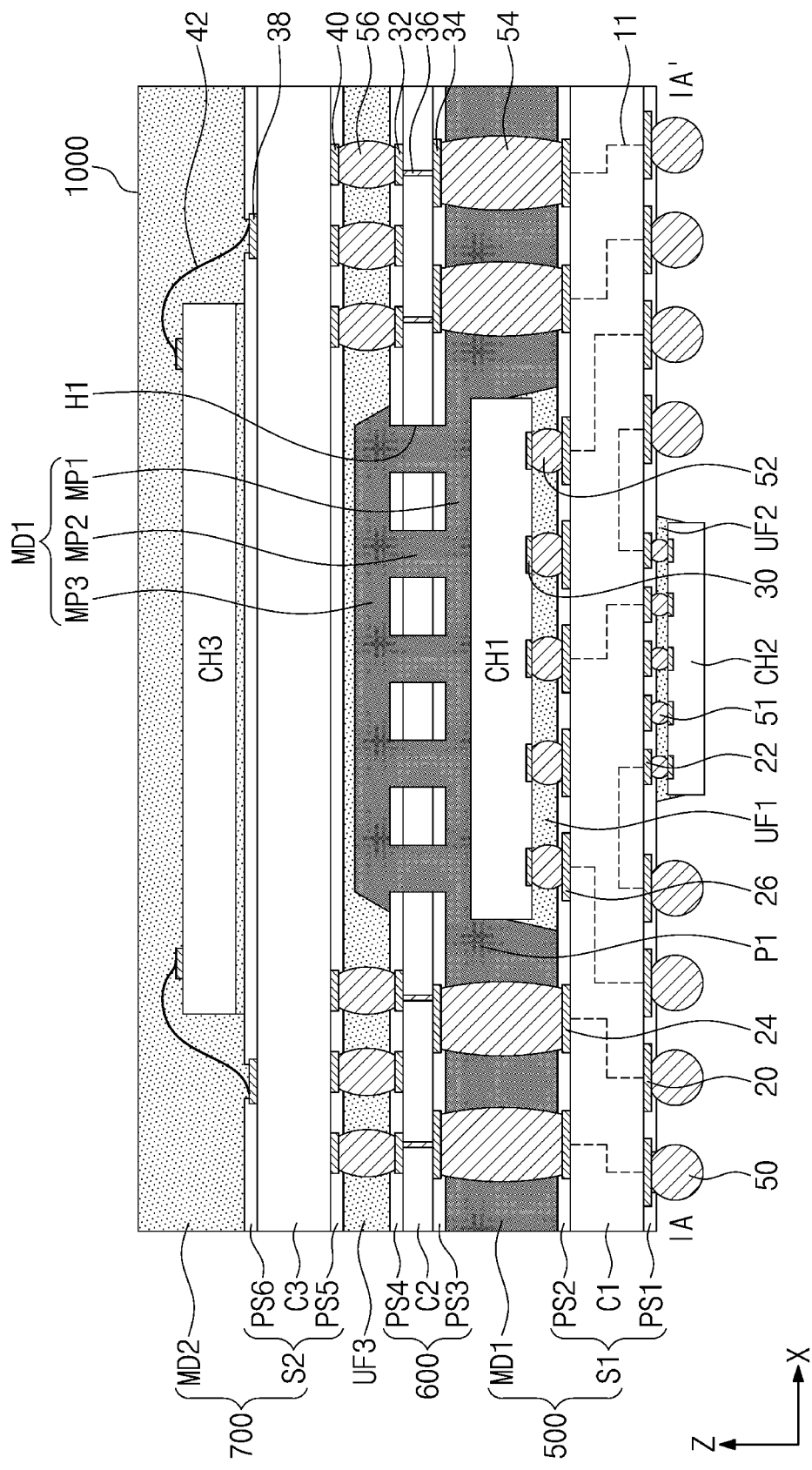
FIG. 4 is a sectional view taken along a line IA-IA' of FIG. 1.

FIG. 4 is a sectional view taken along a line IA-IA' of FIG. 1.

Referring to FIG. 4, in a semiconductor package 1000 according to the present example embodiment, a third under-fill layer UF3 may be interposed between the interposer substrate 600 and the second sub-semiconductor package 700. The third under-fill layer UF3 may be extended to be interposed between the mold protruding portion MP3 and the second package substrate S2. The third under-fill layer UF3 may fill a space between the fourth inner connection members 56. Except for the above-described differences, the semiconductor package according to the present example embodiment may have substantially the same features as described with reference to FIGS. 1 to 3B.

FIGS. 5A to 5E are sectional views illustrating a process of fabricating the semiconductor package according to an example embodiment.

Referring to FIGS. 5A and 5B, the first package substrate S1 may be prepared. The first package substrate S1 may include chip regions R1 and a separation region SR therebetween. The first package substrate S1 may have the same or similar structure as described with reference to FIG. 2, in each of the chip regions R1. The first semiconductor devices CH1 may be respectively mounted on the chip regions R1 of the first package substrate S1 in a flip-chip bonding manner using the first inner connection members 52. The first under-fill layer UF1 may be formed between each of the first semiconductor devices CH1 and the first package substrate S1. Thereafter, first preliminary connection members 54a may be bonded to the first upper conductive pads 24 of the first package substrate S1, which are located around the first semiconductor devices CH1. The first preliminary connection members 54a may be solder balls, conductive bumps, or conductive pillars.

The interposer substrate 600 may be prepared. The interposer substrate 600 may have the same or similar structure as described with reference to FIG. 2, at a position corresponding to the chip region R1. At least one first hole 62 may be formed in the interposer substrate 600 through a laser drilling process or the like. The first hole 62 may be formed so that the side surface surrounding the first hole 62 are rough, as a result of the laser drilling process. Second preliminary connection members 54b may be bonded to the third lower conductive pads 34 of the interposer substrate 600. Thereafter, the interposer substrate 600 may be placed over the first package substrate S1.

Figure 5C:
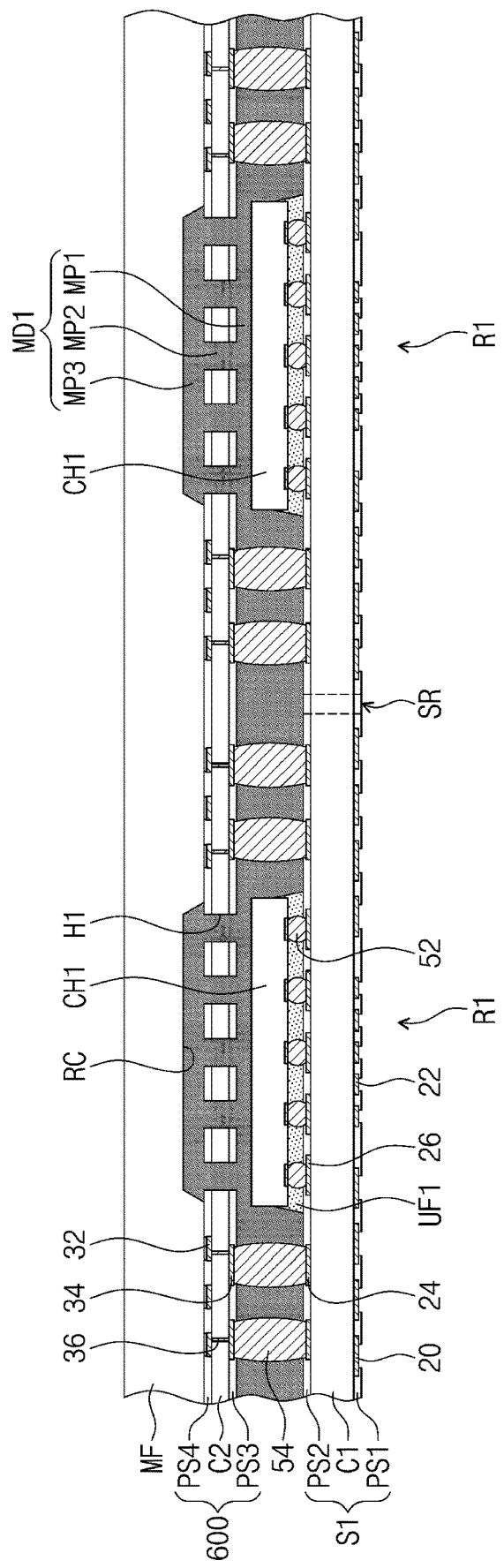

Referring to FIGS. 5B and 5C, the first preliminary connection members 54a may be provided to be in contact with the second preliminary connection members 54b, respectively, and then, a reflow process may be performed on the resulting structure. The reflow process may be performed at a temperature that is higher than a melting point of the first and second preliminary connection members 54a and 54b. Thus, the first and second preliminary connection members 54a and 54b may be melted, and as a result, the third inner connection members 54 may be formed. Due to the high process temperature in the reflow process, a warpage may occur in the interposer substrate of the related art. However, according to an example embodiment, the first hole 62 can prevent or suppress a thermal/physical stress from propagating through the interposer substrate 600, and thus, the warpage in the interposer substrate 600 may be suppressed or reduced in an example embodiment.

Referring to FIG. 5C, a molding frame MF may be placed on the interposer substrate 600. A recess region RC may be formed in the molding frame MF to be overlapped with the first hole 62. A mold resin solution may be supplied into a space between the interposer substrate 600 and the first package substrate S1. The mold resin solution may be supplied to the recess region RC of the molding frame MF through the first hole 62. The mold resin solution may fill the space, which is formed between the interposer substrate 600 and the first package substrate S1, the first hole 62, and the recess region RC. The first mold member MD1 may be formed by curing the mold resin solution. Thus, the first mold member MD1 may be formed to include the mold main portion MP1 between the interposer substrate 600 and the first package substrate S1, the mold extended portion MP2 in the first hole 62, and the mold protruding portion MP3 in the recess region RC. In addition, the mold main portion MP1, the mold extended portion MP2, and the mold protruding portion MP3 may be formed to constitute a single object. Since the mold extended portion MP2 is formed to be in contact with the rough side surface H1 formed by the first hole 62, the side surface HSW of the mold extended portion MP2 may have a rough profile, which is transcribed from the rough side surface H1, as shown in FIG. 3B. The side surface MSW of the mold protruding portion MP3 is formed through the transcription of the surface of the molding frame MF, and, thus, it may be smooth as shown in FIG. 3B.

Figure 5D:
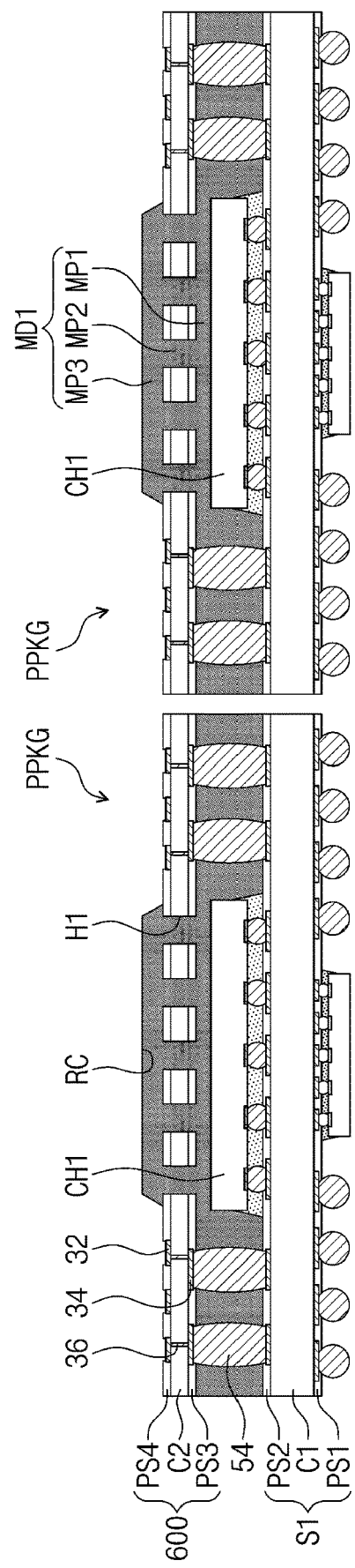
Figure 5E:
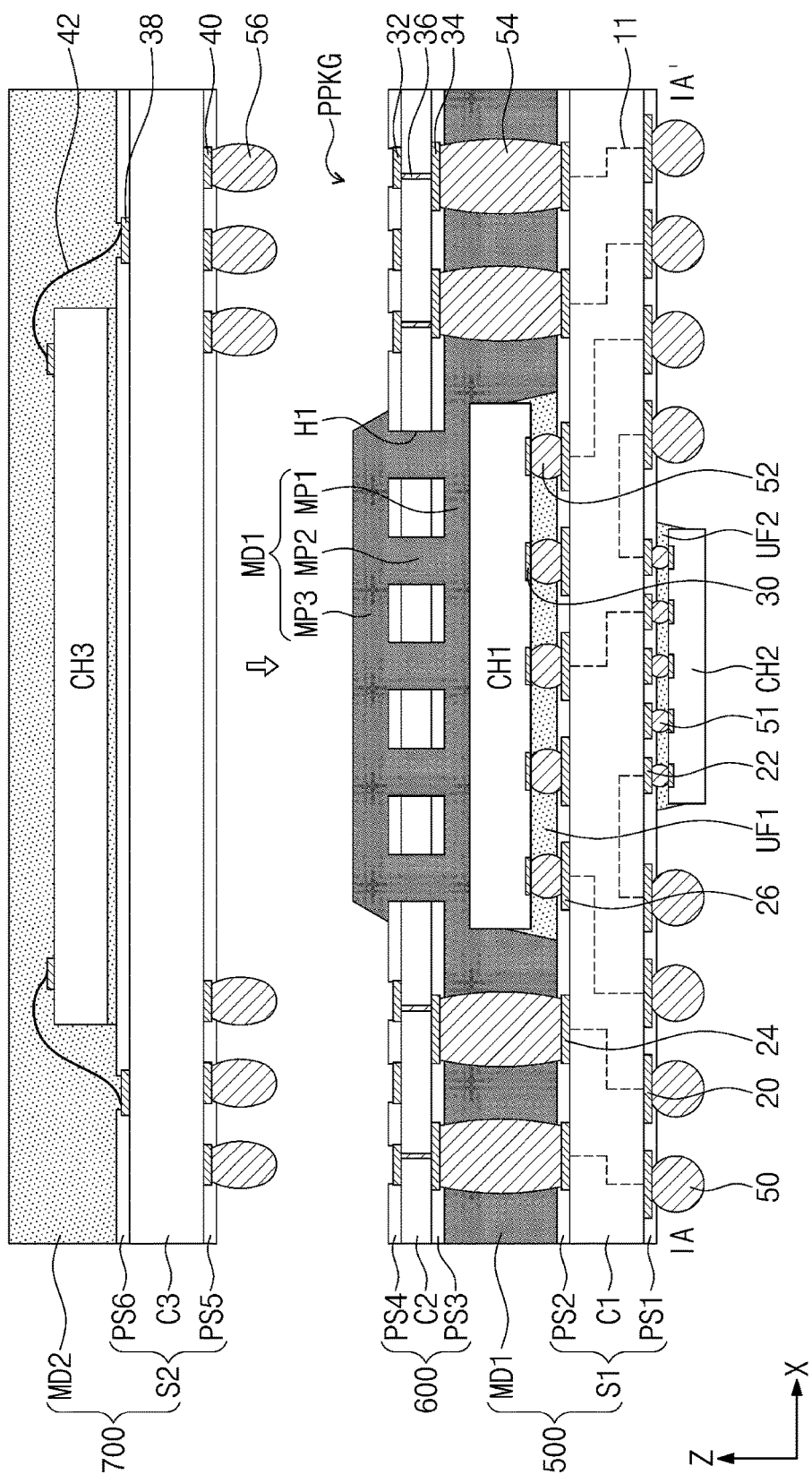

Referring to FIG. 5D, a sawing or singulation process may be performed to remove the interposer substrate 600, the first mold member MD1, and the first package substrate S1 on the separation region SR. Thus, preliminary semiconductor packages PPKG, each of which includes the first sub-semiconductor package 500 and the interposer substrate 600 stacked thereon, may be formed. Each of the preliminary semiconductor packages PPKG may be tested for failure and the preliminary semiconductor packages PPKG in which no failure has been detected may be selected.

Referring back to FIG. 5E, the second sub-semiconductor packages 700 may be prepared. Each of the second sub-semiconductor packages 700 may be tested for failure and the second sub-semiconductor packages 700 in which no failure has been detected may be selected. Thereafter, the second sub-semiconductor package 700 may be bonded to the preliminary semiconductor package PPKG in a flip-chip bonding manner. As a result, the semiconductor package 1000 of FIG. 2 may be fabricated.

Figure 6A:
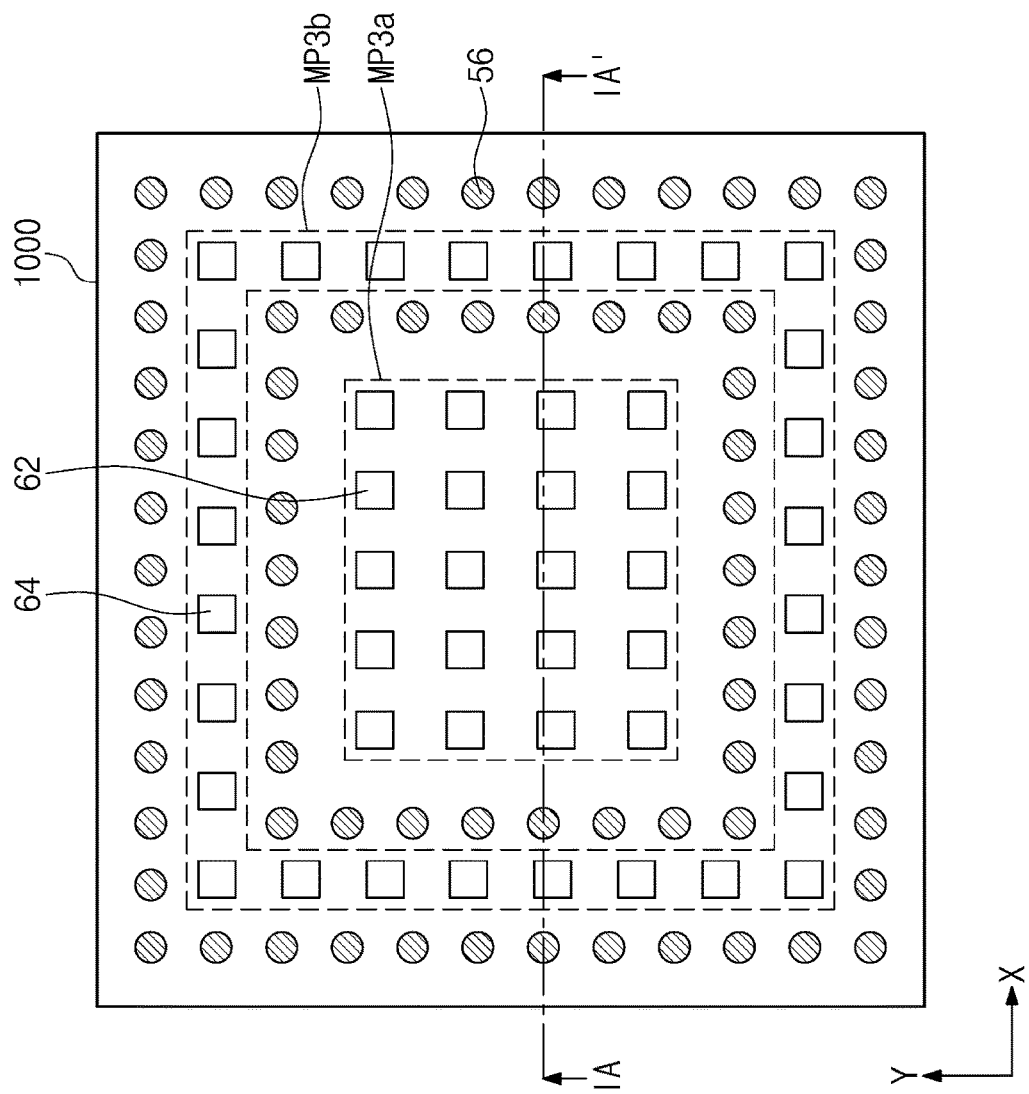
FIG. 6A is a plan view illustrating a semiconductor package according to an example embodiment.
Figure 6B:
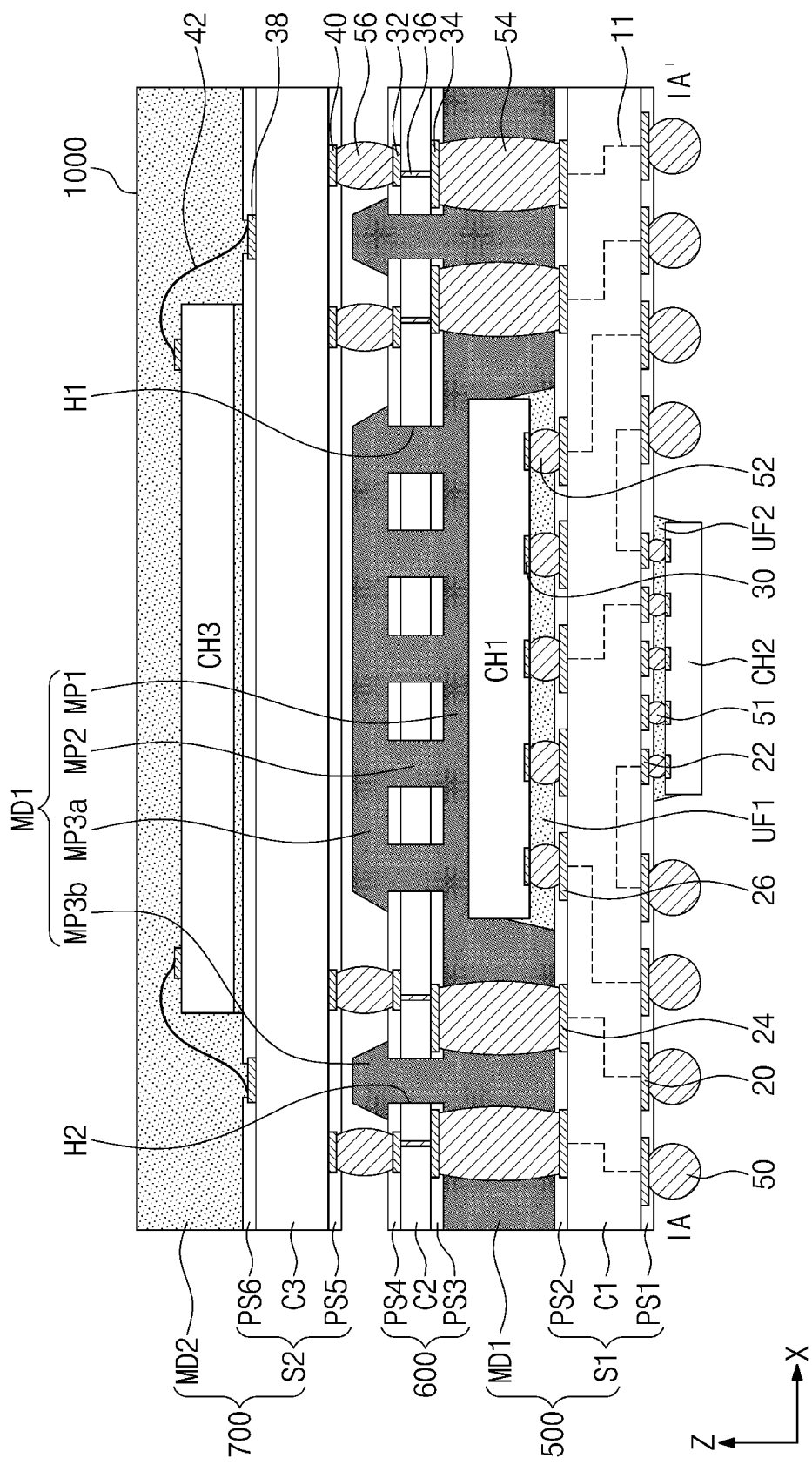
FIG. 6B is a sectional view of a semiconductor package taken along a line IA-IA' of FIG. 6A.

FIG. 6A is a plan view illustrating a semiconductor package according to an example embodiment. FIG. 6B is a sectional view of a semiconductor package taken along a line IA-IA' of FIG. 6A.

Referring to FIGS. 6A and 6B, in a semiconductor package 1000 according to the present example embodiment, the interposer substrate 600 may include a plurality of the first holes 62 and one or more second holes 64. The first holes 62 may be two-dimensionally arranged in a center portion of the interposer substrate 600. The second holes 64 may be disposed in an edge portion of the interposer substrate 600 and may be formed to have rough or smooth surrounding surfaces. The second holes 64 may be disposed to surroundingly enclose the first holes 62. The second holes 64 may be overlapped with a region between the fourth inner connection members 56. The first mold member MD1 may include the mold main portion MP1, mold extended portions MP2, a first mold protruding portion MP3*a*, and a second mold protruding portion MP3*b*. The mold extended portions MP2 may be extended from the mold main portion MP1 and may be inserted into the first and second holes 62 and 64, respectively. The first mold protruding portion MP3*a* may protrude outside the first holes 62 and may have a flat plate shape, when viewed in a plan view. The second mold protruding portion MP3*b* may protrude outside the second holes 64 and may have a closed loop shape enclosing the first mold protruding portion MP3*a*, when viewed in a plan view. The second mold protruding portion MP3*b* may be located between the fourth inner connection members 56. Except for the above-described differences, the semiconductor package according to the present example embodiment may have substantially the same features as that described with reference to FIGS. 1 to 4.

Figure 7A:
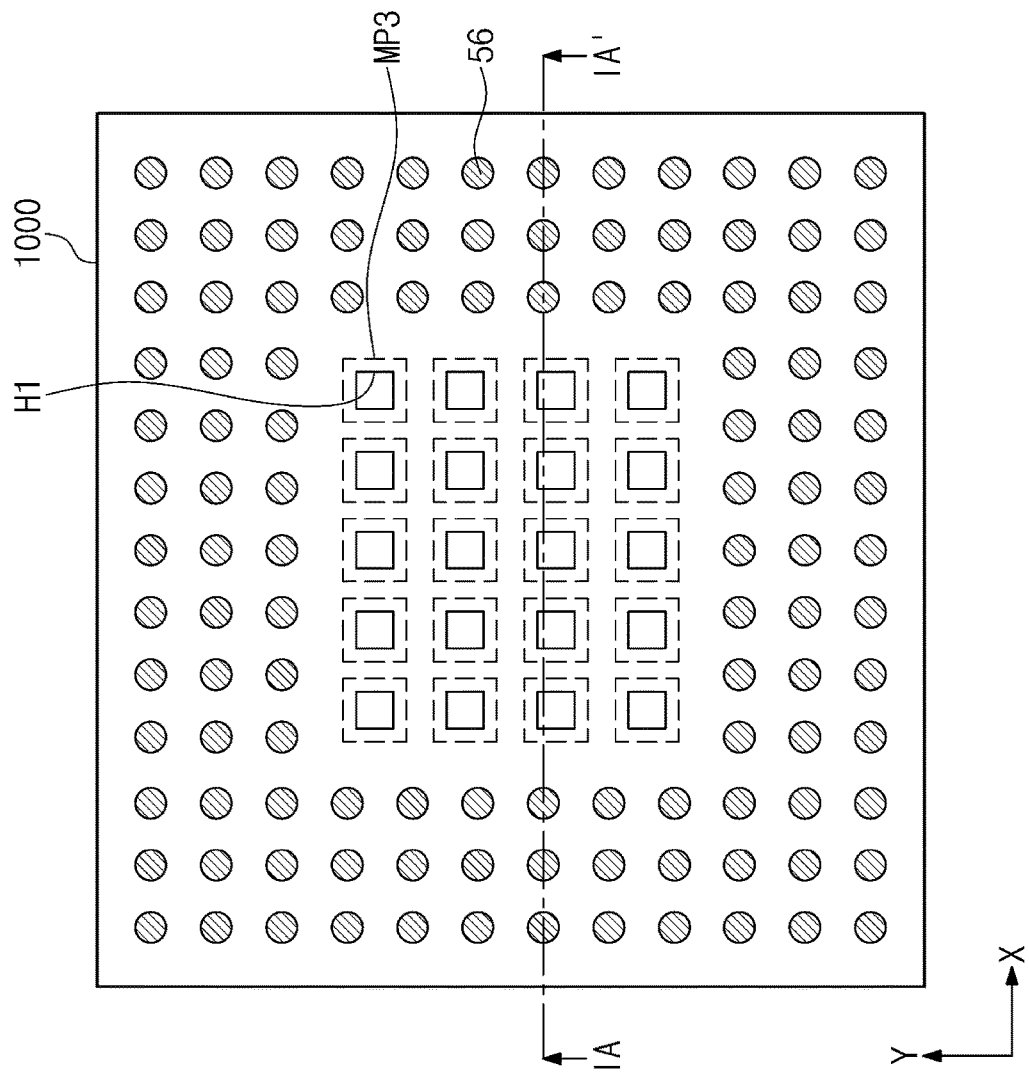
FIG. 7A is a plan view illustrating a semiconductor package according to an example embodiment.
Figure 7B:
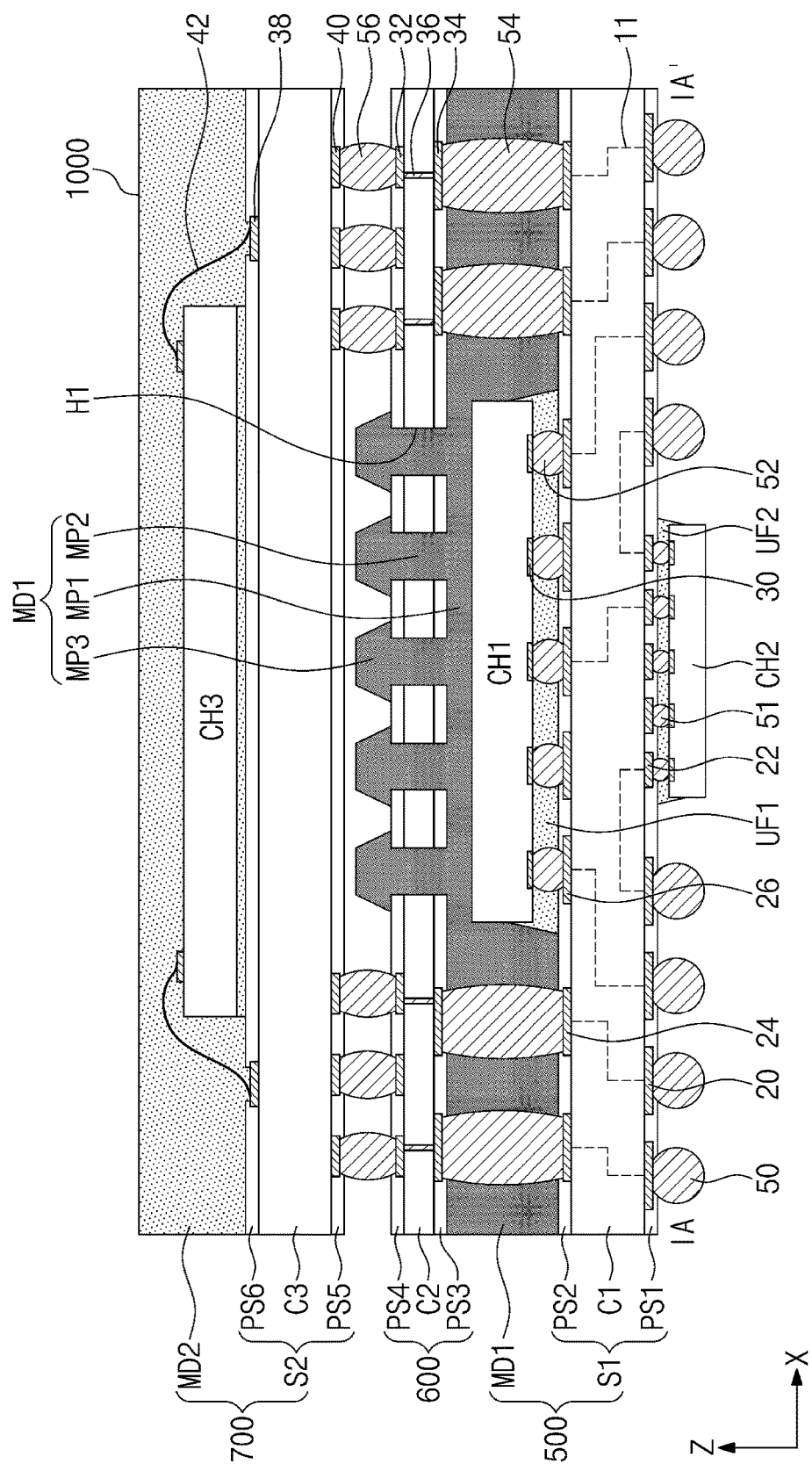
FIG. 7B is a sectional view of a semiconductor package taken along a line IA-IA' of FIG. 7A.

FIG. 7A is a plan view illustrating a semiconductor package according to an example embodiment. FIG. 7B is a sectional view of a semiconductor package taken along a line IA-IA' of FIG. 7A.

Referring to FIGS. 7A and 7B, in a semiconductor package 1000 according to the present example embodiment, the interposer substrate 600 may include a plurality of the first holes 62. The first holes 62 may be disposed in the center region of the interposer substrate 600. The first mold member MD1 may include a plurality of mold protruding portions MP3. The mold protruding portions MP3 may protrude outside respective ones of the first holes 62, may be spaced apart from each other, and are not be in contact with each other. The mold protruding portions MP3 may have an isolated island shape, when viewed in a plan view. Except for the above-described differences, the semiconductor package according to the present example embodiment may have substantially the same features as that described with reference to FIGS. 1 to 4.

Figure 8B:
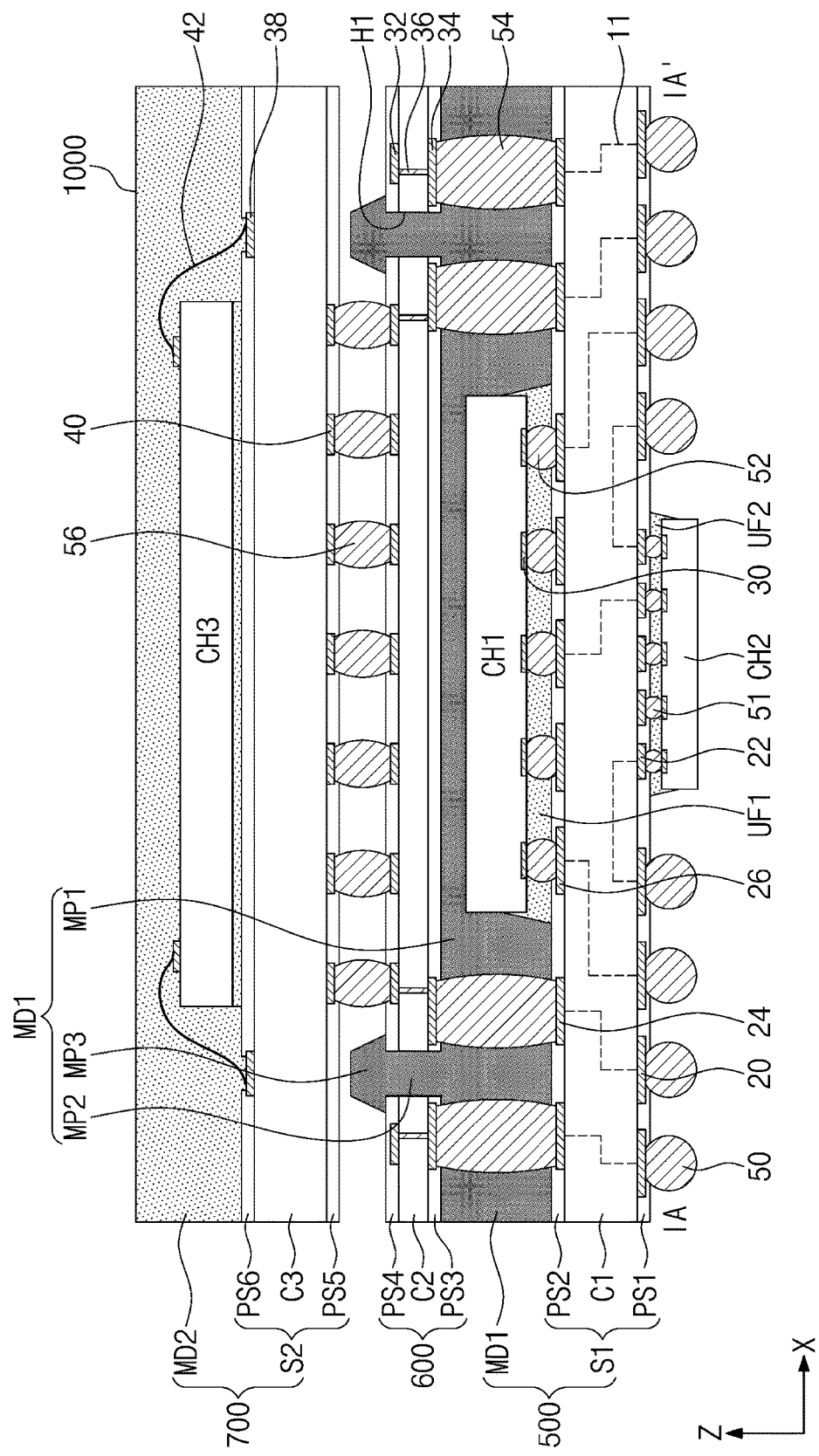
FIG. 8B is a sectional view of a semiconductor package taken along a line IA-IA' of FIG. 8A.

FIG. 8A is a plan view illustrating a semiconductor package according to an example embodiment. FIG. 8B is a sectional view of a semiconductor package taken along a line IA-IA' of FIG. 8A.

Referring to FIGS. 8A and 8B, in a semiconductor package 1000 according to the present example embodiment, the interposer substrate 600 may include a plurality of the first holes 62, which are arranged in an edge portion thereof. The fourth inner connection members 56 may be disposed on the center region of the interposer substrate 600, and when viewed in a plan view, the first holes 62 may be disposed to surroundingly enclose the fourth inner connection members 56. The mold protruding portion MP3 may have a closed loop shape enclosing the fourth inner connection members 56, when viewed in a plan view. Except for the above-described differences, the semiconductor package according to the present example embodiment may have substantially the same features as that described with reference to FIGS. 1 to 4.

The numbers, the dispositions, and the planar shapes of the first holes 62 and the mold protruding portion MP3 are not be limited to those shown in FIGS. 1 to 8B and may be variously changed.

According to an example embodiment, a semiconductor package may include an interposer substrate with at least one hole, and thus, it may be possible to reduce a thermal or physical stress and to suppress or reduce the warpage in the semiconductor package. In addition, a mold protruding portion, which protrudes out of the hole, may support a second sub-semiconductor package and may prevent the second sub-semiconductor package from being excessively bent or drooping. Thus, the reliability of the semiconductor package may be improved.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor package, comprising:
  a first sub-semiconductor package, an interposer substrate, and a second sub-semiconductor package that are sequentially stacked, wherein the first sub-semiconductor package comprises a first package substrate, a first semiconductor device, and a first mold member that are sequentially stacked, the interposer substrate comprises at least one hole, the first mold member comprises:
- a mold main portion which covers the first semiconductor device;
- a mold connecting portion extended from the mold main portion and inserted into the at least one hole; and
- a mold protruding portion extended from the mold connecting portion to cover a top surface of the interposer substrate outside the at least one hole, and the mold main portion, the mold connecting portion, and the mold protruding portion constitute a single object.

2. The semiconductor package of claim 1, wherein the mold connecting portion is in direct contact with an inner side surface of the interposer substrate that surrounds the at least one hole.

3. The semiconductor package of claim 1, wherein the mold protruding portion covers 50% to 80% of an area of the top surface of the interposer substrate.

4. The semiconductor package of claim 1, wherein, in a plan view, the mold protruding portion has one of a plate shape, a closed loop shape, or an island shape.

5. The semiconductor package of claim 1, wherein the mold protruding portion comprises a first mold protruding portion and a second mold protruding portion spaced apart from each other, and
the second mold protruding portion has a closed loop shape which encloses the first mold protruding portion.

6. The semiconductor package of claim 1, wherein the interposer substrate further comprises an upper conductive pad and a lower conductive pad that are respectively disposed on the top surface and a bottom surface thereof, and a conductive via, which connects the upper conductive pad to the lower conductive pad,
the conductive via has a first width,
the mold connecting portion has a second width, and
the second width is greater than the first width.

7. The semiconductor package of claim 6, wherein the first width is in a range of 10 μm to 70 μm, and
the second width is in a range of 500 μm to 1000 μm.

8. The semiconductor package of claim 1, wherein the first mold member further comprises filler particles dispersed throughout the first mold member,
the mold connecting portion has a first width,
each of the filler particles has a second width, and
the first width is greater than the second width.

9. The semiconductor package of claim 1, wherein a surface roughness of a side surface of the mold connecting portion is greater than a surface roughness of a side surface of the mold protruding portion.

10. The semiconductor package of claim 1, wherein the second sub-semiconductor package comprises a second package substrate, a second semiconductor device, and a second mold member that are sequentially stacked, and
the mold protruding portion is spaced apart from the second package substrate.

11. The semiconductor package of claim 10, further comprising an under-fill layer interposed between the interposer substrate and the second package substrate and between the mold protruding portion and the second package substrate.

12. The semiconductor package of claim 10, further comprising:
first inner connection members penetrating the first mold member and connecting the first package substrate to the interposer substrate; and
second inner connection members connecting the interposer substrate to the second package substrate,
wherein a number of the second inner connection members is greater than a number of the first inner connection members.

13. A semiconductor package, comprising:
a first sub-semiconductor package, an interposer substrate, and a second sub-semiconductor package that are sequentially stacked,
wherein the first sub-semiconductor package comprises a first package substrate, a first semiconductor device, and a first mold member that are sequentially stacked,
the interposer substrate comprises:
at least one hole,
an upper conductive pad and a lower conductive pad, which are respectively disposed on a top surface and a bottom surface of the interposer substrate, and
a conductive via, which connects the upper conductive pad to the lower conductive pad and has a first width,
the first mold member comprises:
a mold main portion which covers the first semiconductor device;
a mold connecting portion extended from the mold main portion and inserted into the at least one hole, the mold connecting portion having a second width which is greater than the first width of the via; and
a mold protruding portion extended from the mold connecting portion to cover the top surface of the interposer substrate outside the at least one hole.

14. The semiconductor package of claim 13, wherein the first mold member comprises filler particles dispersed throughout the first mold member,
each of the filler particles has a third width, and
the second width is greater than the third width.

15. The semiconductor package of claim 13, wherein a surface roughness of a side surface of the mold connecting portion is greater than a surface roughness of a side surface of the mold protruding portion.

16. A semiconductor package, comprising:
a first package substrate;
a first semiconductor device mounted on the first package substrate;
a first mold member which covers the first semiconductor device;
an interposer substrate provided on the first mold member and comprising at least one hole;
a second package substrate provided on the interposer substrate;
a second semiconductor device mounted on the second package substrate;
first inner connection members which penetrate the first mold member and connect the first package substrate to the interposer substrate; and
second inner connection members which connect the interposer substrate to the second package substrate, a number of the second inner connection members being greater than a number of the first inner connection members, wherein the first mold member is extended onto a top surface of the interposer substrate through the at least one hole.

17. The semiconductor package of claim 16, wherein the interposer substrate further comprises:
- an upper conductive pad and a lower conductive pad, which are respectively disposed on the top surface and a bottom surface of the interposer substrate, and
- a conductive via, which connects the upper conductive pad to the lower conductive pad and has a first width,
- wherein the at least one hole has a second width, and
- the second width is greater than the first width.

18. The semiconductor package of claim 16, wherein the first mold member further comprises filler particles dispersed throughout the first mold member,
- the at least one hole has a first width,
- each of the filler particles has a second width, and
- the first width is larger than the second width.

19. The semiconductor package of claim 16, wherein a surface roughness of an inner side surface of the interposer substrate that surrounds the at least one hole is greater than a surface roughness of a side surface of the first mold member that protrudes above the interposer substrate.

20. The semiconductor package of claim 16, wherein the interposer substrate comprises a body layer, and an upper protection layer and a lower protection layer that cover the top surface and a bottom surface, respectively, of the body layer, and
- the first mold member is in contact with side surfaces of the body layer, the upper protection layer, and the lower protection layer that are exposed by the at least one hole, respectively.

* * * * *